(12) United States Patent
Imaoka et al.

(10) Patent No.: US 6,290,777 B1
(45) Date of Patent: Sep. 18, 2001

(54) METHOD AND DEVICE FOR WASHING ELECTRONIC PARTS MEMBER, OR THE LIKE

(75) Inventors: Takashi Imaoka; Yukinari Yamashita, both of Toda (JP)

(73) Assignees: Organo Corp.; Alps Electric Co., Ltd., both of Tokyo (JP)

( * ) Notice: Subject to any disclaimer, the term of this patent is extended or adjusted under 35 U.S.C. 154(b) by 0 days.

(21) Appl. No.: 09/242,601

(22) PCT Filed: Aug. 19, 1997

(86) PCT No.: PCT/JP97/02852

§ 371 Date: Feb. 19, 1999

§ 102(e) Date: Feb. 19, 1999

(87) PCT Pub. No.: WO98/08248

PCT Pub. Date: Feb. 26, 1998

(30) Foreign Application Priority Data

Aug. 20, 1996 (JP) .................................................... 8-237294
Oct. 29, 1996 (JP) .................................................... 8-303626
Oct. 29, 1996 (JP) .................................................... 8-303627

(51) Int. Cl.[7] ................................ B08B 3/12; B08B 6/00; C03C 23/00; C23G 1/02

(52) U.S. Cl. .................................. 134/1; 134/1.3; 134/2; 134/3

(58) Field of Search ............................... 134/1, 1.3, 2, 3, 134/902

(56) References Cited

U.S. PATENT DOCUMENTS

| 5,190,627 | * | 3/1993 | Saito et al. | 204/158 |
| 5,578,193 | * | 11/1996 | Aoki et al. | 205/746 |
| 5,599,438 | * | 2/1997 | Shiramizu et al. | 205/746 |
| 5,616,221 | * | 4/1997 | Aoki et al. | 204/252 |
| 5,617,887 | * | 4/1997 | Shibano | 134/184 |
| 5,635,053 | * | 6/1997 | Aoki et al. | 205/746 |
| 5,656,095 | * | 8/1997 | Honda et al. | 134/1 |
| 5,676,760 | * | 10/1997 | Aoki et al. | 134/1.3 |
| 5,979,474 | * | 11/1999 | Manako | 134/102.1 |
| 6,039,055 | * | 3/2000 | Akatsu | 134/1.3 |
| 6,039,815 | * | 3/2000 | Yeol et al. | 134/2 |
| 6,082,373 | * | 6/2000 | Sakurai et al. | 134/1 |
| 6,086,057 | * | 7/2000 | Mitsumori et al. | 261/122.1 |

FOREIGN PATENT DOCUMENTS 7-263398    10/1995  (JP) .
7-263430    10/1995  (JP) .
8-126873    5/1996   (JP) .

* cited by examiner

Primary Examiner—Randy Gulakowski
Assistant Examiner—Yolanda E. Wilkins
(74) Attorney, Agent, or Firm—Fish & Richardson P.C.

(57) ABSTRACT

An electronic parts members, or the like, such as the silicon wafer, etc., is washed with wash water. The wash water is prepared by dissolving a hydrogen gas or ozone gas in ultra pure water and has a negative or positive oxidation-reduction potential. This wash water has remarkably improved detergency for electronic parts. In addition, when the pH of the wash water is adjusted, the electronic parts members can be washed more effectively.

26 Claims, 4 Drawing Sheets

METHOD AND DEVICE FOR WASHING ELECTRONIC PARTS MEMBER, OR THE LIKE

TECHNICAL FIELD

The present invention relates to a method and device for cleaning electronic parts members such as semiconductor substrates, glass substrates, electronic parts and components for the manufacturing apparatus thereof or the like.

BACKGROUND ART

In the process of manufacturing electronic parts members such as LSI chips or the like, the chips may be required to have extremely clean surfaces thereof. In the process of manufacturing LSI chips, for example, an insulator film of material such as $SiO_2$ is formed on the surface of the silicon wafer, and then a resist layer is formed on the insulator film in the predetermined pattern. The insulator film where the resist layer is not formed is etched to expose the metal silicon underneath said insulator film, and then the surface thereof is cleaned. Then elements of p-type or n-type are introduced according to the intended use, forming embedded metal wiring patterns such as Al patterns (lithography process). Said steps are repeated to complete the LSI chips. At the time of introducing elements of p-type or n-type, or in the process of forming embedded metal wiring patterns on the chips, adhesion of impurities such as particulate foreign materials, metals, organic matter and natural oxide film to the exposed surface of silicon may lead to the degradation of the chip' characteristics due to deficient electrical connection between the metal wiring and the metal silicon and an increase in contact resistance. Therefore, in the process for manufacturing LSI chips, the cleaning step of the surface of the silicon wafer is very important for producing high performance chips, requiring as much removal of impurities adherent to the wafer surface as possible.

Conventionally, the cleaning of the silicon wafer is carried out by the combination of cleaning by a solution such as a sulfuric acid-hydrogen peroxide mixture solution, a hydrochloric acid-hydrogen peroxide mixture solution, a hydrofluoric acid solution, ammonium fluoride solution, and cleaning by high-purity water to remove organic matter, particles, metals or natural oxide films adhered to the surfaces of the silicon wafer without damaging the flatness of the surface of the silicon wafer at atomic level.

A detailed example of the conventional cleaning process of silicon wafers will be described in the steps from (1) to (13) below:
(1) Step of cleaning with sulfuric acid-hydrogen peroxide; cleaning with a mixture solution of sulfuric acid and hydrogen peroxide solution in a volume ratio of 4:1 at 130° C., 10 min.
(2) Step of cleaning with high-purity water; cleaning with high-purity water for 10 min.
(3) Step of cleaning with hydrofluoric acid; cleaning with hydrofluoric acid in a concentration of 0.5% for 1 min.
(4) Step of cleaning with high-purity water; cleaning with high-purity water for 10 min.
(5) Step of cleaning with ammonia-hydrogen peroxide; cleaning with a mixture solution of ammonia water, hydrogen peroxide solution and high-purity water in a volume ratio of 0.05:1:5 at 80° C. for 10 min.
(6) Step of cleaning with high-purity water; cleaning with high-purity water for 10 min.
(7) Step of cleaning with hydrofluoric acid; cleaning with hydrofluoric acid in a concentration of 0.5% for 1 min.
(8) Step of cleaning with high-purity water; cleaning with high-purity water for 10 min.
(9) Step of cleaning with hydrochloric acid-hydrogen peroxide; cleaning with a mixture solution of hydrochloric acid, hydrogen peroxide solution and high-purity water in a volume ratio of 1:1:6 at 80° C. for 10 min.
(10) Step of cleaning with high-purity water; cleaning with high-purity water for 10 min.
(11) Step of cleaning with hydrofluoric acid; cleaning with hydrofluoric acid in a concentration of 0.5% for 1 min.
(12) Step of cleaning with high-purity water; cleaning with high-purity water for 10 min.
(13) Spin dehydration or IPA steam drying In the above step (1), removing chiefly the organic matter adhered to the surface of the silicon wafer is carried out. In the step (5), mainly to remove the particulate adhered to the surface of the silicon wafer is carried out. In the step (9), mainly to remove metal impurities adhered to the surface of the silicon wafer is carried out. Further, in the steps (3), (7) and (11), to remove the natural oxide film on the surface of the silicon wafer is carried out. Furthermore, each cleaning solution in each step is often capable of removing other contaminants than those principal ones. Since, for example, said sulfuric acid-hydrogen peroxide solution used in the step (1) also has a powerful ability to remove adherent metallic impurities in addition to adherent organic matter, a method is also available for removing a plurality of contaminating objects with a single cleaning solution, in addition to the method for removing a different impurity with each cleaning solution described above.

In the cleaning process of silicon wafers, as a method for contacting cleaning agents or high-purity water to the surface of silicon wafer, a method so-called a batch type cleaning method is frequently employed, wherein a plurality of silicon wafers are soaked batchwise in a cleaning bath containing a cleaning solution or high-purity water. Furthermore, there has been used as a cleaning process while carrying our circulation and filtration of cleaning solution to prevent contamination thereof, and as rinsing processes with high-purity water after treatment with cleaning solution, an overflow rinse system, wherein high-purity water is supplied from the bottom of the cleaning bath and overflowed from the top, and a quick dump rinse system, wherein high-purity water fills the cleaning bath once deep enough to soak the entire surface of wafers and then is dumped from the bottom in a single action. Recently, in addition, there has been used a method for showering the wafer surface with cleaning solutions or high-purity water, and a method for cleaning by spraying cleaning solutions or high-purity water to the center of wafers rotating at high speed, so-called "single wafer rinse".

The cleaning treatment with high-purity water performed after the cleaning with cleaning solutions described above is to rinse remaining cleaning solutions off from the wafer surface. Therefore, high-purity water from which particles, colloidal substances, organic matter, metal ions, anions, a dissolved oxygen gas or the like have been mostly removed to the extreme is used as the rinse water. Such high-purity water is also used as a solvent of cleaning solutions.

Recently, the density of integration of LSI has increased dramatically. The lithography process is now performed as many as 20 to 30 times in the manufacturing process of LSI, although it was done no more than several times in the early stage of LSI. This increase in the number of the lithography processes requires a correspondingly increased frequency of cleaning wafers. Thus, the cost of products is rising with the increasing costs, such as material cost of cleaning solutions and high-purity water and post-treatment cost of used cleaning solutions and used high-purity water, cost of air venting to remove the gas of cleaning solutions from the clean room produced by high temperature cleaning, and the like cost.

In the manufacturing process of LSI as mentioned above, particles adhered to the surface of the silicon wafer reduce the yield of LSI significantly. It is, therefore, particularly important to remove particles from the surface of the wafer. Conventionally, an ammonia-hydrogen peroxide mixture solution has been used to remove the particles adhered to the surface of the silicon wafer. However, ammonia and hydrogen peroxide react with each other to form chemical species other than themselves. The cleaning effect of these chemical species has not been identified. Also, scientific knowledge has not been obtained as to which composition and ratio of ammonia and hydrogen peroxide are most suitable for effective cleaning. Thus, the concentration of ammonia-hydrogen peroxide mixture solution presently used is higher than necessary to remove particles on the surface of the wafer thoroughly. That is, in order to remove particles on the surface of the wafer, the surface may be etched by using some alkaline solution, but in this case, it is necessary to prevent detached particles from being adhering again to the surface of the wafer. To do so, the code of surface potential of the surface of the wafer and particles needed to be made the same in order to repulse each other electrically. To accomplish this, the pH of the cleaning solution had to be raised to get strong alkaline solution. Further, since the use of such strong alkaline solution resulted in roughened surface of the wafer unnecessarily, hydrogen peroxide solution had to be added to the cleaning solution to form oxide film on the surface of the wafer by virtue of hydrogen peroxide, so that the roughened surface of the wafer could be avoided. As a result, there have been problems such as spending a lot of reagents unnecessarily, increased use of high-purity water for rinsing and increased cost for effluent treatment.

Additionally, in said prior art cleaning processes, there is likely to exist the following several problems, when the rinsing with high-purity water follows the cleaning with hydrofluoric acid to remove the natural oxide film formed on the surface of silicon wafers.

First, the high-purity water containing a dissolved oxygen gas of 10 ppm or less is used to prevent the surface of a silicon wafer from being oxidized by a dissolved oxygen gas. However, the oxygen gas in the air dissolves in high-purity water in a moment at a cleaning bath because the cleaning bath is usually not airtight (the concentration of a dissolved oxygen gas may increase to about 100 ppm). The surface of a silicon wafer may be subjected to oxidation by such high-purity water used for cleaning and in particular, in the case of n+ silicon susceptible to oxidation, oxide film of a few angstroms is easily formed on the surface of a silicon wafer.

Second, even though the above mentioned problem associated with the oxygen gas in the air dissolved into high-purity water is solved by making the cleaning bath air-tight, the surface of silicon wafers may be etched by hydroxyl ions, thus roughened surface up to a few angstroms in depth being produced. This is because of hydroxyl ions present in neutral high-purity water in the concentration of $10^{-7}$ mole/l. Furthermore, silicon detached through etching by hydroxyl ions may adhere to the surface of silicon wafers, thus causing foggy surface of silicon wafers.

Moreover, in the cleaning process of LSI or the like as mentioned above, organic matter attached to the surface of the silicon wafer deteriorates the performance of LSI and reduces the yield of LSI significantly. Additionally, the film of organic matter includes inside thereof metal impurities and particles attached thereto and natural oxide film formed. Thus, there has bee a problem in that cleaning with hydrofluoric acid solution, hydrochloric acid-hydrogen peroxide and ammonium hydroxide-hydrogen peroxide mixture solution cannot remove metal impurities, particles and natural oxide film thoroughly.

For this reason, the conventional cleaning process is usually designed to remove organic matter first. As shown in the example of cleaning process mentioned earlier, the conventional cleaning with sulfuric acid-hydrogen peroxide mixture solution is mainly used to remove organic matters. However, the use of highly concentrated sulfuric acid-hydrogen peroxide mixture solution of several ten percents requires a lot of reagent (sulfuric acid and hydrogen peroxide) and high-purity water for rinsing after cleaning. This entails not only increased reagent cost for the preparation of sulfuric acid-hydrogen peroxide mixture solution, but also a large scale effluent and waste water treatment system for the used sulfuric acid-hydrogen peroxide mixture solution and high-purity water used in the rinsing process, raising the problems of increased manufacturing cost of products due to installation cost of such treatment system and increased running cost thereof. Cleaning with sulfuric acid-hydrogen peroxide mixture solution usually performed at elevated temperature requires not only some heat source, but also air venting to remove the gas of cleaning agents from the clean room produced by such high temperature cleaning, thus raising a problem of increased cost due to heat source and air venting.

Recently, a method is beginning to be put to practical use which cleans and removes organic matter by using high-purity water with a dissolved ozone gas. It is suggested that cleaning be performed at room temperature for ten minutes by using high-purity water with the dissolved ozone gas of, for example, 2 through 10 ppm. However, this method of using high-purity water with the dissolved ozone gas at room temperature also present a problem in that if organic matter attached is too much or it is scantly degradable, it is difficult to remove organic matter thoroughly, leading to the possibility of leaving organic matter attached even when cleaning for a longer period of time.

DISCLOSURE OF THE INVENTION

The present inventors have carried out researches to solve the above problems, focused on oxidation-reduction potential of cleaning solutions and studied as to how oxidation-reduction potential of liquid affects surface potential. As a result, we have eventually found that if the oxidation-reduction potential of liquid is in the area of reduction, the negatively charged surface potential of wafer and particles can be obtained, so that particles can be prevented from being attached again to the surface of the wafer by electric repulsion even if pH is almost neutral. Based on this result, the present invention has been completed. It is an object of the present invention to provide a method and device for cleaning electronic parts members or the like which can contribute to the reduction of the used amount of cleaning solution and high-purity water needed for cleaning, and prevent particles from being attached again and enable surer cleaning even at lower temperature compared with the conventional method and device. Furthermore, the present inventors have researched to solve the above problems and found that oxide film formation on silicon wafer surfaces due to a dissolved oxygen gas and roughened surface of silicon wafers can be avoided by using acid cleaning solutions which have a negative oxidation-reduction potential attained by dissolving a hydrogen gas in high-purity water and which are adjusted to be acidic less than pH 7. Based on this result, we have perfected the present invention. It is another object of the present invention to provide a method and device for cleaning electronic parts members or the like to enable complete cleaning without forming oxide film on electronic parts members or the like, such as silicon wafers, and roughened surface.

As the result of the present inventors' yet further researches to solve the above problems, we have eventually found that easy, sure removal of organic matter can be attained by cleaning with alkaline cleaning solutions prepared by dissolving ozone gas in high-purity water, rather than solely cleaning with high-purity water with ozone gas being dissolved. Based on this result, we have perfected present invention. It is another object of the present invention to provide a method and device for cleaning electronic parts members or the like which can contribute to the reduction of the used amount of reagents and high-purity water needed for cleaning, and attain easy, sure removal of organic matter on the surface of electronic parts members or the like even at lower temperature.

The present invention is to provide a method for cleaning electronic parts members such as electronic components or components for the manufacturing apparatus thereof, further characterized in that electronic parts members or the like are cleaned by cleaning solution prepared by dissolving a hydrogen gas in high-purity water and with a negative oxidation-reduction potential.

In addition, said hydrogen gas-dissolved cleaning solution preferably has pH falling within a range of 7–11. In this case where a hydrogen gas is dissolved to obtain the range of reduction in the oxidation-reduction potential of the solution, negatively charged surface potential of wafer and particles can be obtained in the area from neutral to alkali in terms of pH. Therefore, it is possible to accomplish preventing particles from being attached again to the surface of electronic parts by virtue of electric repulsion. This enables preventing particles from being attached again to the surface of electronic parts, contributing to the reduction of the use of cleaning solutions and high-purity water needed for cleaning, and sure cleaning even at lower temperature than conventional cleaning while preventing particles from being attached again.

Furthermore, in the invention as mentioned earlier where cleaning solution obtained by dissolving a hydrogen gas is made acid, pH falling within a range of 3–7 is preferable. Using acid cleaning solution in which a hydrogen gas is dissolved in high-purity water and which has a negative oxidation-reduction potential and is adjusted to acid side with pH of less than 7 can inhibit the formation of oxide film on the surface of the silicon wafer caused by a dissolved oxygen gas. This also prevents the roughened surface of the silicon wafer. Therefore, the method according to the present invention enables sure cleaning without forming oxide film on the surface, or roughened surface of electronic parts members such as silicon wafer.

In addition, the above mentioned cleaning solution preferably contains a dissolved hydrogen gas of 0.05 ppm or more.

Furthermore, the present invention is characterized by providing a method for cleaning electronic parts members or the like such as electronic components or components for the manufacturing apparatus thereof, in that electronic parts members or the like are cleaned by alkaline cleaning solution prepared by dissolving a ozone gas in high-purity water and with a positive oxidation-reduction potential. Easy and sure removal of organic matter can be attained by cleaning with alkaline cleaning solution prepared by dissolving ozone gas in high-purity water. Therefore, the method can contribute to the reduction of the use of cleaning agents and high-purity water needed for cleaning, and attain easy, sure removal of organic matters on the surface of electronic parts members or the like even at lower temperature.

In this case, the above mentioned alkaline cleaning solution preferably contains a dissolved ozone gas of 0.05 ppm or more.

Further, the present invention is characterized in that pH of this cleaning solution containing an ozone gas is preferably falling within a range of 7–11.

Yet further, the above described cleaning solution containing a dissolved hydrogen gas or ozone gas preferably uses high-purity water degassed to contain a dissolved oxygen gases such as oxygen of less than 10 ppm.

Further, the above electronic parts members or the like are cleaned by the cleaning solution preferably while applying ultrasonic wave.

Yet further, the frequency of the ultrasonic wave is preferably 30 kHz or more.

Further, in the case of applying ultrasonic wave, the cleaning solution preferably further contains a dissolved rare gas.

Yet further, cleaning is preferably carried out by controlling the temperature of the cleaning solution in the range from 20° C. to 60° C.

Further, the hydrogen gas or ozone gas is preferably dissolved in high-purity water by way of gas permeable membrane.

In addition, the device according to the present invention for cleaning electronic parts members or the like is adapted to carry out the above-described method.

The method according to the present invention enables enhancing cleaning effect by altering oxidation-reduction potential by dissolving gasses and using appropriate pH, depending on the intended use. Furthermore, degassing prior to gas dissolving can make the properties of cleaning solution better. Also, heating, applying ultrasonic wave and the like during cleaning can make the cleaning more effective.

BEST MODE FOR CARRYING OUT THE INVENTION

Electronic parts members or the like to be cleaned (objects to be cleaned) in the present invention can be exemplified by various materials and parts used in the field of manufacturing electronic parts, concretely, comprising substrate materials such as silicon substrates, semiconductor substrates such as semiconductor wafers of III-V group elements and glass substrates used for liquid crystals, memory elements, CPU and sensor elements, in the form of either finished products or semi-finished products, or components for the manufacturing apparatus thereof such as a quartz reaction tube, cleaning bath and substrate carrier. High-purity water in the present invention is a high-purity water prepared by treating raw water such as industrial water, city water, well water, river water, lake water or the like in a pretreatment apparatus carrying out treatments such as coagulating sedimentation, filtration, coagulating filtration, active carbon adsorption, and so forth to remove large suspended solids and organic matter in the raw water;

treating the pretreated water in a primary deionized water production apparatus mainly comprising deionizers such as ion exchange unit, reverse osmosis unit and the like to remove not only metal ions and anions but other impurities such as particles, colloidal materials, organic matter, as much as possible, in order to obtain primary deionized water; and treating the primary deionized water circularly in a secondary deionized water production apparatus comprising ultraviolet irradiation apparatus, mixed-bed type ion exchange polisher and membrane separation unit such as ultafiltration unit and reverse osmosis unit successively to remove remaining impurities such as particles, colloidal materials, organic matter, metal ions and anions as much as possible, yielding high-purity water. The water quality of high-purity water in the present invention is that represented by, for example, resistivity $\geq 17.0$ MΩ·cm, total organic carbon $\leq 100$ μg C/1, number of particles $\leq 50$/ml (diam. >0.07 μm), CFU $\leq 50/1$, silica $\leq 10$ μg $SiO_2/1$, sodium $\leq 0.1$ μgNa/1. A high-purity water-producing device in the present invention refers to a combination of the pretreatment apparatus, primary deionized water production apparatus and secondary deionized water production apparatus.

The primary deionized water production apparatus may includes in the latter part thereof degassing unit such as a vacuum degassing unit and a membrane degassing unit using gas permeable membrane. The raw water may include plant recovery water mixed with industrial water, city water, well water, river water, lake water or the like.

First Embodiment

Figure 1:
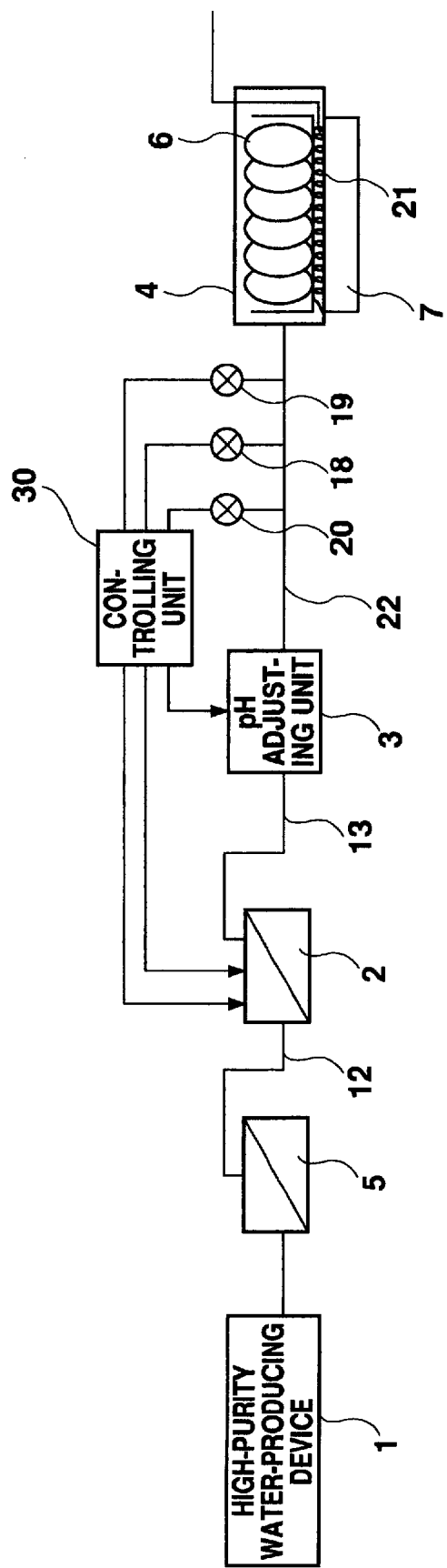
FIG. 1 is a conceptual diagram showing the configuration of a cleaning device according to the first and second embodiment of the invention.

FIG. 1 shows one example of the cleaning device of electronic parts members or the like according to the invention. In FIG. 1, numeral 1 designates a high-purity water-producing device, 2 a gas dissolving bath, 3 a pH-adjusting unit and 4 a cleaning bath. The device further comprises as necessary a degassing unit 5 for removing gas dissolved in high-purity water produced in the high-purity water-producing device 1, and a ultrasonic wave applying unit 7 for applying ultrasonic wave to objects 6 to be cleaned in the cleaning bath 4.

The high-purity water-producing device 1 comprises a pretreatment apparatus, a primary deionized water production apparatus and a secondary deionized water production apparatus. The pretreatment apparatus is to treat raw water by way of a coagulating sedimentation unit, a sand filtration unit, and an active carbon adsorption unit. The primary deionized water production apparatus is to treat the pretreatment water to obtain primary deionized water by way of a reverse osmosis unit, a two-bed ion exchange system, a mixed-bed type ion exchange polisher and a precision filter unit. The secondary deionized water production apparatus is to treat the primary deionized water to remove remaining particles, colloidal materials, organic matter, metal ions, anions and the like by way of ultraviolet irradiation, mixed-bed type ion exchange polisher and ultrafiltration treatment.

High-purity water produced with the high-purity water-producing device 1 preferably has the water quality, for example, shown in Table 1 described below. When high-purity water of such water quality is used, it is believed that no contaminating impurities derived from the high-purity water adhere to wafer.

TABLE 1

| RESISTIVITY | $\leq 18.8$ MΩ·cm |
| TOTAL ORGANIC CARBON | $\geq 10$ μg C/l |
| NUMBER OF PARTICLES | $\leq 10$/ml (diam. $\geq 0.07$ μm) |
| CFU | $\leq 10/l$ |
| SILICA | $\leq 1$ μg $SiO_2/l$ |
| SODIUM | $\leq 0.01$ μg Na/l |
| IRON | $\leq 0.01$ μg Fe/l |
| COPPER | $\leq 0.01$ μg Cu/l |
| CHLORIDE IONS | $\leq 0.01$ μg Cl/l |
| HYDROGEN ION CONCENTRATION (pH) | 7 |
| OXIDATION-REDUCTION POTENTIAL | +50 mV (vs. NHE) |

In the gas-dissolving bath 2, a hydrogen gas is dissolved in high-purity water produced in the high-purity water-producing device 1. Prior to this step, gasses dissolved in high-purity water are preferably removed by way of the degassing unit 5. In the degassing unit 5, it is preferable to remove especially oxygen gas, nitrogen gas and carbon dioxide gas dissolved in high-purity water, and the concentration of one or more kind of dissolved gasses are made less than 10 ppm, and preferably 2 ppm or less. If the concentration of dissolved gasses is 10 ppm or more, during cleaning bubbles are formed to adhere to the objects to be cleaned, thus lowering cleaning effect for the bubble-adhered part. In the degassing unit 5, as the method for degassing the gasses dissolved in high-purity water, a method of vacuum degassing via gas permeable membrane is preferable.

In the gas-dissolving bath 2, a hydrogen gas is dissolved in high-purity water from which oxygen gas, nitrogen gas, carbon dioxide gas and the like have been removed in the degassing unit 5. Cleaning solution obtained by dissolving a hydrogen gas in high-purity water in the gas-dissolving bath 2 has a negative oxidation-reduction potential. The concentration of a dissolved hydrogen gas in cleaning solution is preferably 0.05 ppm or more, and preferably in the range from 0.8 to 1.6 ppm at 25° C. under atmospheric pressure. If the concentration of a dissolved hydrogen gas is less than 0.05 ppm, there may be a case where the concentration is not enough to bring the oxidation-reduction potential of solution to the reduction side. As a result, as shown hereafter in Table 2 of Example, the effect of removing particles adhered to the surface of the object to be cleaned tends to decrease.

Namely, in order to obtain sufficient effect of removing particles in cleaning, it can be said that neutral to alkaline side in terms of pH is preferable for cleaning solution with a hydrogen gas being dissolved in high-purity water. Thus, pH of 8 or more turns out to give sufficient effect of removing particles.

Methods for dissolving a hydrogen gas in high-purity water can be exemplified by various processes such as hydrogen gas introduction and dissolution into high-purity water by way of gas permeable membrane; hydrogen gas bubbling and dissolution into high-purity water; hydrogen gas dissolution into high-purity water by way of ejector; hydrogen gas introduction into suction side of a pump which feeds high-purity water to the gas-dissolving bath 2 and dissolution by means of agitation inside the pump which feeds high-purity water to the gas-dissolving bath 2. A hydrogen gas to be dissolved in high-purity water in the gas-dissolving bath 2 is preferably high-purity hydrogen gas produced by way of the electrolysis of high-purity water.

Figure 2:
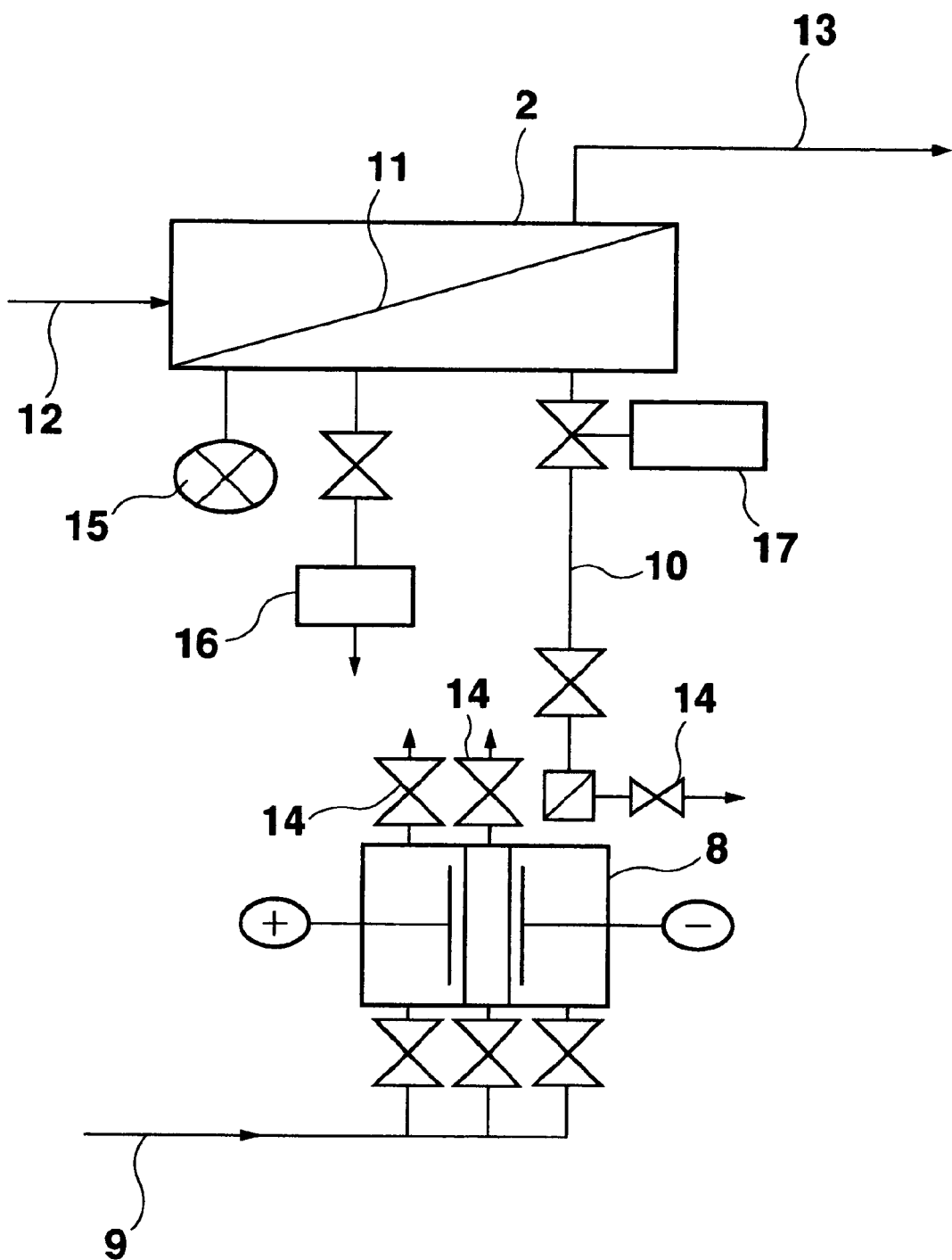
FIG. 2 is a conceptual diagram showing the configuration of a preferable gas-dissolving unit according to the invention.

FIG. 2 shows an example of the process of dissolving a hydrogen gas in high-purity water in the gas-dissolving bath 2, wherein the hydrogen gas is obtained by way of electrolysis of high-purity water. In this example, the hydrogen gas is dissolved in high-purity water by way of gas permeable membrane. Referring to FIG. 2, numeral 8 denotes a high-purity water electrolyzer, and high-purity water introduced into the high-purity water electrolyzer 8 through a high-purity water supply piping 9 is subjected to electrolysis in the electrolyzer 8 to generate high-purity hydrogen in a cathodic chamber of the electrolyzer 8, which is then delivered to the gas-dissolving bath 2 through a hydrogen gas supply piping 10. A permeable membrane 11 is provided in the gas-dissolving bath 2 and, a hydrogen gas supplied from the high-purity water electrolyzer 8 via the gas permeable membrane 11 is dissolved into high-purity water which is introduced into the gas-dissolving bath 2 through a high-purity water supply piping 12 and the high-purity water containing a dissolved hydrogen gas thus produced is delivered to the pH-adjusting unit 3 through a supply piping 13. Referring to FIG. 2, numeral 14 denotes drain valves to discharge high-purity water after electrolysis, 15 a pressure gauge to measure the hydrogen gas pressure in the gas-dissolving bath 2, 16 an exhaust gas handling unit to vent a hydrogen gas supplied to the gas-dissolving bath 2, and 17 a hydrogen flow controller to control the amount of hydrogen gas supplied.

In the pH-adjusting unit 3, pH of the cleaning solution dissolving a hydrogen gas in the gas-dissolving bath 2 is adjusted preferably to 7 or more, and more preferably to 7 or more and less than 11, and most preferably from 8 to 10. In order to adjust pH, alkaline aqueous solution such as ammonia water, sodium hydroxide, potassium hydroxide, tetramethyl-ammoniumhydroxide (TMAH) and the like, and alkaline gas such as ammonia gas and the like are used. It is preferable to use ammonia water and ammonia gas, because there are no metal ions or organic ions as counter ions to hydroxyl ion ($OH^-$), and volatile counter ion ($NH_4^-$)is unlikely to adhere to object to be cleaned. If pH is less than 7, as shown hereafter in Table 2 of Example, the effect of removing particles on the surface of objects to be cleaned tends to decrease. If pH is 11 or more, as shown hereafter in Tables 2 and 3 of Example, the surface of objects to be cleaned tends to be roughened. As the pH-adjusting units 3, the configuration shown in FIGS. 3 and 4 may be used.

Cleaning solution with pH being adjusted in the pH-adjusting unit 3 to be delivered to the cleaning bath 4 preferably contains a dissolved hydrogen gas of 0.05 ppm or more and its pH is preferably 7 or more. To accomplish this, it is preferable to provide a redox potentiometer 18, dissolved hydrogen gas concentration meter 19 and hydrogen ion concentration meter 20 anywhere along the cleaning solution supply piping 22 supplying cleaning solution to the cleaning bath 4 to always monitor oxidation-reduction potential, dissolved hydrogen gas concentration and pH of the cleaning solution so as to enable controlling the amount of a hydrogen gas dissolved in high-purity water in the gas-dissolving bath 2, and the amount of alkali to be added in the pH-adjusting unit 3. These are controlled by a controlling unit 30. There may be a separate controlling unit 30 for each object (hydrogen gas or alkali) to be controlled.

Methods for cleaning objects to be cleaned 6 by the above described cleaning solution in the cleaning bath 4 can be exemplified by various processes such as batch cleaning process in which objects 6 to be cleaned are soaked in the cleaning solution, circular cleaning process in which the cleaning solution is circulated to bring objects 6 to be cleaned into contact therewith, over flow cleaning process in which the cleaning solution is supplied from the bottom of the cleaning bath 4 and overflowed from the top thereof, showering cleaning process in which objects 6 to be cleaned are showered with cleaning solution, and spraying cleaning process in which the cleaning solution is sprayed to objects 6 to be cleaned rotating at high speed.

A heater 21 is disposed in the cleaning bath 4 to adjust the temperature of the cleaning solution as necessary. To achieve better cleaning effect, it is preferable to control the temperature of the cleaning solution in the range from 20 to 60° C. The application of ultrasonic wave during cleaning enhances the cleaning effect. Preferably, ultrasonic wave of more than 30 kHz is employed which is generated from the ultrasonic wave application unit 7. The ultrasonic wave is applied, for example, in the case of the batch cleaning process, while objects 6 to be cleaned are soaked in the cleaning solution supplied to the cleaning bath 4, and in the case of the spraying cleaning process, wherein the cleaning solution is sprayed from spray nozzles to objects 6 to be cleaned 6, to the cleaning solution at upstream of the nozzles.

When the ultrasonic wave is applied during cleaning, preferably a rare gas may be additionally dissolved in the cleaning solution. Examples of the rare gas include helium, neon, argon, krypton, xenon or a mixture thereof of two kinds or more, and the rare gas may preferably be dissolved into the cleaning solution in the concentration not less than 0.05 ppm. The rare gas dissolution process is preferably after degassing process, wherein oxygen, nitrogen and other gasses dissolved in high-purity water are degassed in the degassing unit 5. The rare gas and hydrogen gas dissolution is preferably made simultaneously or continuously in the gas-dissolving bath 2. As methods for dissolving rare gas, the methods similar to those used to dissolve a hydrogen gas in high-purity water may be employed.

The cleaning device according to the present invention is preferably gas tight to prevent an oxygen gas, nitrogen gas, carbon dioxide gas, etc. in the air from entering into high-purity water or cleaning solution. In the above embodiment, pH is adjusted in the pH-adjusting unit 3 after a hydrogen gas is dissolved in high-purity water in the gas-dissolving bath 2. However, pH may be adjusted before dissolving the hydrogen gas.

The wafer is cleaned to remove particles on the surface with the cleaning solution made up by dissolving a hydrogen gas in high-purity water as mentioned above and which has a negative oxidation-reduction potential. Then, after being rinsed with high-purity water, it is transferred to, for example, surface metal removing process.

Example of First Embodiment

The first embodiment will be described in detail by following Example:

Example 1-1 through 1-8, Comparative Example 1-1 through 1-3

Silicon wafers (n-Si 100) of 6 inch, after being soaked in diluted hydrofluoric acid solution in a concentration of 0.5% for 10 minutes, were rinsed with high-purity water for 5 minutes using overflow-rinsing method and then soaked in the polluted liquid prepared by adding aluminum particles of 1 μm in average diameter to high-purity water to give the concentration of 10000 particles/milliliter. Then, the wafers were rinsed with high-purity water for 5 minutes using overflow-rinsing method, and then subjected to spin dehydration. These every 25 samples were cleaned with cleaning solution under such conditions as shown in Table 2 respectively, while applying ultrasonic wave of 950 kHz, 1200 w, and then rinsed with high-purity water for 5 minutes, and then subjected to spin dehydration.

Cleaning solution of Example 1-1 was prepared by dissolving a hydrogen gas in high-purity water without adjusting pH. Cleaning solutions of Examples 1-2 through 1-5 and 1-7 were prepared by dissolving a hydrogen gas in high-purity water with pH adjusted with ammonia water. Cleaning solution of Example 1-6 was prepared by dissolving a hydrogen gas and argon gas in high-purity water with pH adjusted with ammonia water. Cleaning solution of Example 1-8 was prepared by dissolving a hydrogen gas and carbon dioxide gas in high-purity water. Cleaning solution of Comparative Example 1-1 was high-purity water itself. Cleaning solution of Comparative Example 1-2 was prepared by dissolving ammonia water and hydrogen peroxide solution, but not a hydrogen gas. Cleaning solution of Comparative Example 1-3 was prepared by hydrogen peroxide solution, but not a hydrogen gas. The capacity of the cleaning bath was 10 liters. In the case of batch-type overflow method, the amount of overflow was 1 liter/min. In Table 2, the number of aluminum particles adhered to the surface of the wafer before and after cleaning the wafer polluted with aluminum particles is shown together with the degree of roughness of the surface of the wafer after cleaning.

The number of aluminum particles adhered to the surface of the wafer was measured with the laser scatter-type wafer surface attached particle counter (made by TOPCON:WH -3) for the particles not less than 0.2 μm, and the average value of 25 wafers are shown in Table 2.

The degree of roughness of the surface of the wafer was measured on the interatomic-force microscope (made by Seiko Electronic Industry: AFM-SPI 3600). The evaluation was made with the following ranking.

○ center line average roughness (RMS) less than 5 Å
X center line average roughness (RMS) 5 Å or more

TABLE 2

| | | CONCENTRATION OF DISSOLVED GAS (ppm) | | | | OXIDATION- REDUCTION POTENTIAL mV | | |
|---|---|---|---|---|---|---|---|---|
| | $O_2$ | $N_2$ | $CO_2$ | $H_2$ | Ar | (vs. NHE) | pH | COMPOSITION |
| EXAMPLE | | | | | | | | |
| 1 | <1 | <1 | <1 | 0.8 | — | −280 | 7 | pH UNADJUSTED |
| 2 | <1 | <1 | <1 | 0.8 | — | −600 | 8 | CLEANING SOLUTION CONTAINING AMMONIA (0.02 ppm) |
| 3 | <1 | <1 | <1 | 0.8 | — | −690 | 11.5 | CLEANING SOLUTION CONTAINING AMMONIA (50 ppm) |
| 4 | <1 | <1 | <1 | 0.07 | — | −560 | 8 | CLEANING SOLUTION CONTAINING AMMONIA (0.02 ppm) |
| 5 | <1 | 10.1 | <1 | 0.8 | — | −566 | 8 | CLEANING SOLUTION CONTAINING AMMONIA (0.02 ppm) |
| 6 | <1 | <1 | <1 | 0.8 | ADDITION | −624 | 8 | CLEANING SOLUTION CONTAINING AMMONIA (0.02 ppm) |
| 7 | <1 | <1 | <1 | 0.03 | — | −50 | 8 | CLEANING SOLUTION CONTAINING AMMONIA (0.02 ppm) |
| 8 | <1 | <1 | 10 | 0.8 | — | −60 | 6 | CLEANING SOLUTION CONTAINING CARBONATE |
| COMPARATIVE EXAMPLE | | | | | | | | |
| 1 | <1 | <1 | <1 | 0 | — | +400 | 7 | HIGH-PURITY WATER |
| 2 | <1 | <1 | <1 | 0 | — | +450 | 10 | 4.1% AMMONIA WATER- 4.3% HYDROGEN PEROXIDE MIXTURE SOLUTION |
| 3 | <1 | <1 | <1 | 0 | — | +600 | 8 | 4.3% HYDROGEN PEROXIDE SOLUTION |

TABLE 2-continued

| | CLEANING CONDITION | | | NUMBER OF ALUMINUM PARTICLES ADHERED TO THE SURFACE OF THE WAFER (NUMBER) | | DEGREE OF ROUGHNESS OF THE SURFACE OF THE WAFER |
|---|---|---|---|---|---|---|
| | METHOD OF CLEANING | TEMPERATURE OF CLEANING SOLUTION | CLEANING TIME (min.) | BEFORE CLEANING | AFTER CLEANING | |
| EXAMPLE | | | | | | |
| 1 | BATCH-TYPE OVERFLOW METHOD | ROOM TEMPERATURE | 10 | 8000 | 350 | ◯ |
| 2 | BATCH-TYPE OVERFLOW METHOD | ROOM TEMPERATURE | 10 | 7800 | 21 | ◯ |
| 3 | BATCH-TYPE OVERFLOW METHOD | ROOM TEMPERATURE | 10 | 7695 | 25 | X |
| 4 | BATCH-TYPE OVERFLOW METHOD | ROOM TEMPERATURE | 10 | 7888 | 29 | ◯ |
| 5 | BATCH-TYPE OVERFLOW METHOD | ROOM TEMPERATURE | 10 | 7690 | 134 | ◯ |
| 6 | BATCH-TYPE OVERFLOW METHOD | ROOM TEMPERATURE | 10 | 7502 | 25 | ◯ |
| 7 | BATCH-TYPE OVERFLOW METHOD | ROOM TEMPERATURE | 10 | 7700 | 1300 | ◯ |
| 8 | BATCH-TYPE OVERFLOW METHOD | ROOM TEMPERATURE | 10 | 7650 | 1100 | ◯ |
| COMPARATIVE EXAMPLE | | | | | | |
| 1 | BATCH-TYPE OVERFLOW METHOD | ROOM TEMPERATURE | 10 | 7860 | 3500 | ◯ |
| 2 | BATCH-TYPE | 6.5° C. | 10 | 7509 | 380 | ◯ |
| 3 | BATCH-TYPE OVERFLOW METHOD | ROOM TEMPERATURE | 10 | 7505 | 1500 | ◯ |

Example 1-9 through 1-1-3, Comparative Example 1-4 through 1-6

Silicon wafers same as the above Example, after being soaked with hydrofluoric acid solution in the same manner as the above Example, were treated with aluminum particles-polluted liquid in the same manner as the above Example. Every twenty-five samples were cleaned with such cleaning solutions under such conditions as shown in Table 3 respectively, and then rinsed with high-purity water for 5 minutes, and then subjected to spin dehydration.

Cleaning solution of Example 1-9 was prepared by dissolving a hydrogen gas in high-purity water without adjusting pH. Cleaning solutions of Examples 1-10 through 1-13 were prepared by dissolving a hydrogen gas in high-purity water with pH adjusted with ammonia water. Cleaning solutions of Comparative Examples 1-4 through 1-6 were the same as cleaning solutions of Comparative Examples 1-1 through 1-3, respectively. The capacity of the cleaning bath was the same as the above Example. In the case of batch-type overflow method, the amount of overflow was also 1 liter/min. In Examples 1-9 through 1-13, Comparative Examples 1-4 through 1-6, ultrasonic wave was not applied during cleaning. In Table 3, the number of aluminum particles adhered to the surface of the wafer before and after cleaning the wafer polluted with aluminum particles is shown together with the degree of roughness of the surface of the wafer after cleaning.

TABLE 3

| | PROPERTIES OF CLEANING SOLUTION | | | | | | | |
|---|---|---|---|---|---|---|---|---|
| | CONCENTRATION OF DISSOLVED GAS (ppm) | | | | | OXIDATION-REDUCTION POTENTIAL mV | | |
| | $O_2$ | $N_2$ | $CO_2$ | $H_2$ | Ar | (vs. NHE) | pH | COMPOSITION |
| EXAMPLE | | | | | | | | |
| 9 | <1 | <1 | <1 | 0.8 | — | −280 | 7 | pH UNADJUSTED |
| 10 | <1 | <1 | <1 | 0.8 | — | −600 | 8 | CLEANING SOLUTION CONTAINING AMMONIA (0.02 ppm) |
| 11 | <1 | <1 | <1 | 0.8 | — | −690 | 11.5 | CLEANING SOLUTION CONTAINING AMMONIA (50 ppm) |
| 12 | <1 | <1 | <1 | 0.07 | — | −560 | 8 | CLEANING SOLUTION CONTAINING AMMONIA (0.02 ppm) |
| 13 | <1 | 10 | <1 | 0.8 | — | −566 | 8 | CLEANING SOLUTION CONTAINING AMMONIA (0.02 ppm) |
| COMPARATIVE EXAMPLE | | | | | | | | |
| 4 | <1 | <1 | <1 | 0 | — | +400 | 7 | HIGH-PURITY WATER |
| 5 | <1 | <1 | <1 | 0 | — | +450 | 10 | 4.1% AMMONIA WATER-4.3% HYDROGEN PEROXIDE MIXTURE SOLUTION |
| 6 | <1 | <1 | <1 | 0 | — | +600 | 8 | 4.3% HYDROGEN PEROXIDE SOLUTION |

| | CLEANING CONDITION | | | NUMBER OF ALUMINUM PARTICLES ADHERED TO THE SURFACE OF THE WAFER (NUMBER) | | DEGREE OF ROUGHNESS OF THE SURFACE OF THE WAFER |
|---|---|---|---|---|---|---|
| | METHOD OF CLEANING | TEMPERATURE OF CLEANING SOLUTION | CLEANING TIME (min.) | BEFORE CLEANING | AFTER CLEANING | |
| EXAMPLE | | | | | | |
| 9 | BATCH-TYPE OVERFLOW METHOD | ROOM TEMPERATURE | 10 | 8000 | 820 | ○ |
| 10 | BATCH-TYPE OVERFLOW METHOD | ROOM TEMPERATURE | 10 | 7800 | 150 | ○ |
| 11 | BATCH-TYPE OVERFLOW METHOD | ROOM TEMPERATURE | 10 | 7695 | 160 | X |
| 12 | BATCH-TYPE OVERFLOW METHOD | ROOM TEMPERATURE | 10 | 7888 | 165 | ○ |
| 13 | BATCH-TYPE OVERFLOW METHOD | ROOM TEMPERATURE | 10 | 7690 | 55 | ○ |
| COMPARATIVE EXAMPLE | | | | | | |
| 4 | BATCH-TYPE OVERFLOW METHOD | ROOM TEMPERATURE | 10 | 7860 | 6500 | ○ |
| 5 | BATCH-TYPE | 6.5° C. | 10 | 7509 | 950 | ○ |
| 6 | BATCH-TYPE OVERFLOW METHOD | ROOM TEMPERATURE | 10 | 7505 | 3800 | ○ |

With the method according to the first embodiment, since the same or more cleaning effect can be obtained without the need for larger amount of cleaning solution compared with the conventional method, the cost for raw materials and high-purity water used for cleaning solution and the cost for treatment of used cleaning solutions can be reduced, thus contributing to the reduction of the cost of the final product in comparison with that when employing the conventional cleaning method. The cleaning method according to the present invention, which allows particles on the surface of the silicon wafer to be removed more effectively even at lower pH compared with the conventional method using ammonia-hydrogen peroxide mixture solution, can not only reduce the use of ammonia water that has been used in a large quantity-on the conventional method, and therefore the cost for raw material, but also alleviate the load on effluent treatment facilities, thus minimizing the scale of such effluent treatment facilities and reducing the treatment cost. The method according to the present invention, which allows cleaning with lower pH compared with the conventional method, can omit the use of hydrogen peroxide solution which has been used to prevent the roughened surface of the silicon wafer due to alkali, thus further reducing the cost of raw materials and the cost of the effluent treatment.

Second Embodiment

The configuration as a whole is the same as the first embodiment 1 as shown in FIG. 1. In the second embodiment, cleaning solution is made acidic in terms of pH in the pH-adjusting unit to inhibit the formation of oxide film and prevent the surface of objects to be cleaned from being roughened during rinsing after cleaning with reagent.

In the gas-dissolving bath 2, a hydrogen gas is dissolved in high-purity water produced in the high-purity water-producing device 1 in the same manner as the first embodiment. Since degassing of high-purity water is usually performed during the production thereof, the concentration of a dissolved oxygen gas in high-purity water is very low. However, such dissolved oxygen gas is not removed perfectly. Dissolving a hydrogen gas in the high-purity water in the proper amount makes oxidation-reduction potential negative, thus removing aforementioned problems associated with a dissolved oxygen gas. The concentration of a dissolved hydrogen gas is generally not less than 0.05 ppm, and preferably in the range from 0.8 to 1.6 ppm at 25° C. under atmospheric pressure. If the concentration of a dissolved hydrogen gas is less than 0.05 ppm, there may be a case where oxidation-reduction potential cannot be made surely negative. If the concentration of a dissolved hydrogen gas is less than 0.05 ppm, or if the removal of a dissolved oxygen gas is insufficient, it is preferable to remove the dissolved oxygen gas more sufficiently by way of the degassing unit 5, before introducing high-purity water into the gas-dissolving bath 2.

In the high-purity water producing process, a nitrogen gas is usually used to seal most of the vessels for various treatments. Thus, the nitrogen gas is dissolved in high-purity water. The nitrogen gas in high-purity water may not necessarily be removed, because such nitrogen gas is not likely to oxidize or etch the surface of silicon wafers. However, it is preferable to treat high-purity water to remove the nitrogen gas by way of the degassing unit 5 when ultrasonic wave is applied during cleaning. This is because ultrasonic wave is likely to produce ammonium ion and, therefore, increase the pH of high-purity water, if it is applied during cleaning in the presence of the dissolved nitrogen gas.

In the degassing unit 5, it is preferable to remove particularly oxygen and nitrogen gases dissolved in high-purity water, and the concentration of one or more kind of dissolved gasses are made less than 10 ppm, and preferably 2 ppm or less by way of the degassing unit 5. If the concentration of dissolved gasses is 10 ppm or more, during cleaning bubbles are formed to adhere to the objects to be cleaned, thus lowering cleaning effect for the bubble-adhered part. These aspects are the same as those of the first embodiment mentioned earlier. In the degassing unit 5, as the method for the degassing dissolved gasses, vacuum degassing via gas permeable membrane as shown in FIG. 2 is preferable. However, any other suitable method may be employed.

Gas permeable membrane used in the gas-dissolving unit 2 and the degassing unit 5 includes membrane made from materials having an affinity to gasses, such as silicone and the like, and hydrophobic materials such as fluorine resin and the like. Such membrane is manufactured to have a number of fine pores and configured to permeate gas, but not water. Gas permeable membrane may be constructed as hollow yarn. As the method for degassing or gas dissolving, hollow yarn-type membrane may be configured to permeate gas either from inside of the hollow yarn to outside or in the reverse direction.

As the gas-dissolving bath 2, the configuration shown in FIG. 2 is preferable.

After dissolving a hydrogen gas in high-purity water in the gas-dissolving bath 2, pH is adjusted in the pH-adjusting unit 3. In the second embodiment, pH is adjusted preferably to be less than 7, preferably less than 7 and 3 or more, and more preferably in the range from 4 to 6. Adjusting pH of the high-purity water containing a dissolved hydrogen gas to acid side in this way prevents the formation of oxide film on the surface of objects to be cleaned and also prevent roughened surface thereof. Therefore, for such intended use of cleaning, acid cleaning solution containing the dissolved hydrogen gas is suitable for cleaning.

Figure 3:
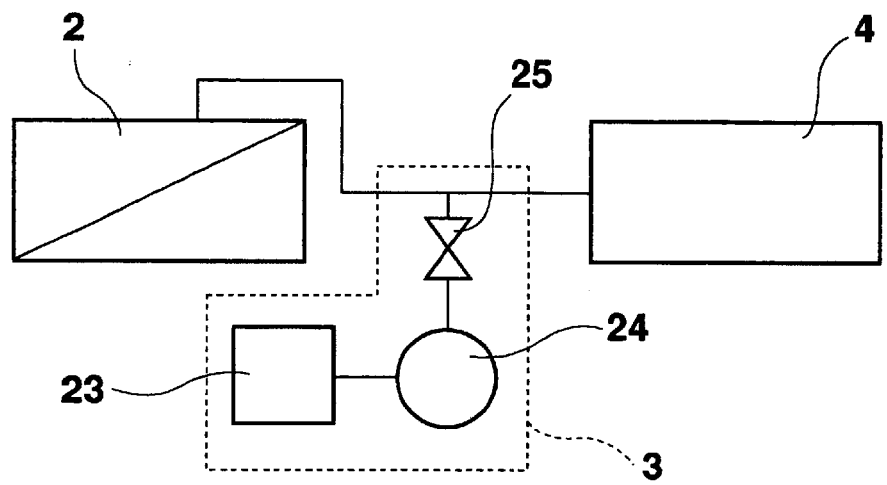
FIG. 3 is a conceptual diagram showing the configuration of an example of a preferable pH-adjusting unit according to the invention.

In order to adjust pH, acids or acid gasses are dissolved in high-purity water containing a dissolved hydrogen gas. As an acid, for example, hydrochloric acid, sulfuric acid, nitric acid, phosphoric acid, hydrofluoric acid or the like is used. As an acid gas, for example, a carbon dioxide gas is used. A preferable method is to adjust pH by dissolving the carbon dioxide gas, because the influence by coexistent ions is low. When an acid is used to adjust pH, the pH adjusting unit 3 may include, for example, an acid reservoir 23 and a pump 24 as shown in FIG. 3, and the acid is added and mixed anywhere in middle of the piping supplying liquid from the gas-dissolving bath 2 to the cleaning bath 4. In FIG. 3, 25 denotes a control valve to adjust fed amount of the acid.

Figure 4:
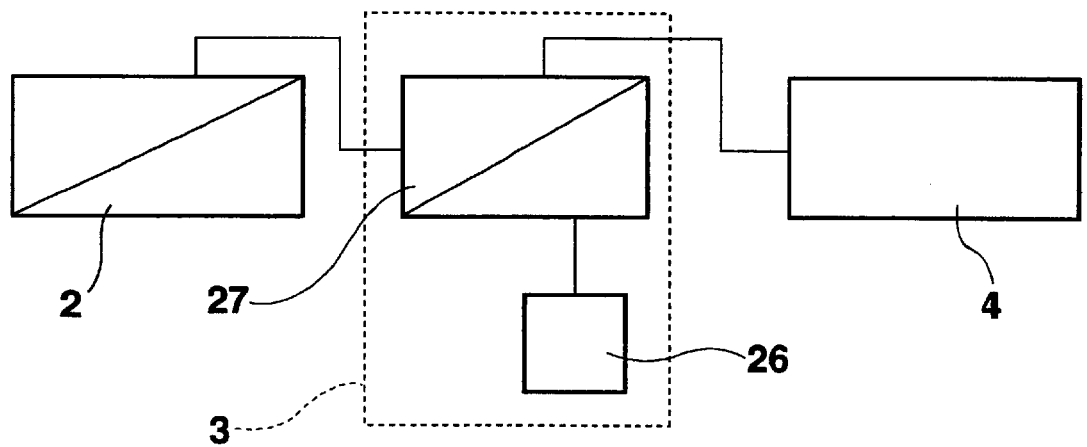
FIG. 4 is a conceptual diagram showing the configuration of another example of a preferable pH-adjusting unit according to the invention.

When an acid gas such as a carbon dioxide gas is used to adjust pH, the pH-adjusting device 3 may include, for example, a supply unit 26 for supplying an acid gas and a gas-dissolving unit 27 as shown in FIG. 4. As the gas-dissolving bath 27, a structure similar to the gas-dissolving bath 2 may be used.

Acidic cleaning solution with pH being adjusted in the pH-adjusting unit 3 to be delivered to the cleaning bath 4 needs to have pH less than 7 and a negative oxidation-reduction potential due to a dissolved hydrogen gas. To accomplish this, it is preferable to provide a redox potentiometer 18, dissolved hydrogen gas concentration meter 19 and hydrogen ion concentration meter 20 anywhere along the cleaning solution supply piping 22 supplying cleaning solution to the cleaning bath 4 to always monitor oxidation-reduction potential, the dissolved hydrogen gas concentration and pH of the cleaning solution so as to enable controlling the amount of a hydrogen gas dissolved in high-purity water in the gas-dissolving bath 2, and the amount of an acid or acid gas to be added in the pH-adjusting unit 3. These (hydrogen gas and acid or acid gas) are controlled by a controlling unit 30.

As with the first embodiment mentioned above, methods for cleaning objects 6 to be cleaned by the acid cleaning solution in the cleaning bath 4 can be exemplified by various processes such as batch cleaning process, circular cleaning process, overflow cleaning process, showering cleaning process in which objects 6 to be cleaned are showered with cleaning solution, and spraying cleaning process in which the cleaning solution is sprayed to objects 6 to be cleaned rotating at high speed.

Also, the configuration and operation of the heater 21 and ultrasonic wave application unit 7 are the same as those of the first embodiment. Again, dissolution of rare gas, air tight structure of cleaning device and location where pH adjustment is carried out are the same as those of the first embodiment.

Example of Second Embodimemt

The present invention will be described in detail by mentioning Example and Comparative Example.

Example 2-1

Surface of a silicon wafer (n+Si 100) of six inch in size was cleaned with RCA to remove impurities and then soaked in diluted hydrofluoric acid in the concentration of 0.5% for ten minutes. The wafer was then subjected to spin dehydration, after cleaning with cleaning solution the composition of which is shown in Table 4, in the cleaning bath shown in FIG. 1. The pH adjustment of the cleaning solution was made with hydrochloric acid using pH-adjusting unit shown in FIG. 3. Oxide film thickness and the degree of roughness of the surface before and after treatment with the cleaning solution were measured and the results are shown in Table 4.

force microscope (made by Seiko Electronic Industry:SPI-3600).

Comparative Example 2-1

The process of Example 3-1 was repeated except that high-purity water shown in Table 4 was used in place of the acid cleaning solution. Oxide film thickness and the degree of roughness of the surface before and after treatment with high-purity water were measured and the result is shown in Table 4.

Example 2-2

Surface of a silicon wafer (n+Si 100) of six inch in size was cleaned with RCA to remove impurities and then soaked in diluted hydrofluoric acid in the concentration of 0.5% for ten minutes. The wafer was then subjected to spin dehydration, after cleaning with the cleaning solution the composition of which is shown in Table 4, in the cleaning bath shown in FIG. 1. The pH adjustment of the cleaning solution was made with carbon dioxide gas using pH-adjusting unit shown in FIG. 4. Oxide film thickness and the degree of roughness of the surface before and after treatment with the cleaning solution were measured and the results are shown in Table 4.

Figure 5:
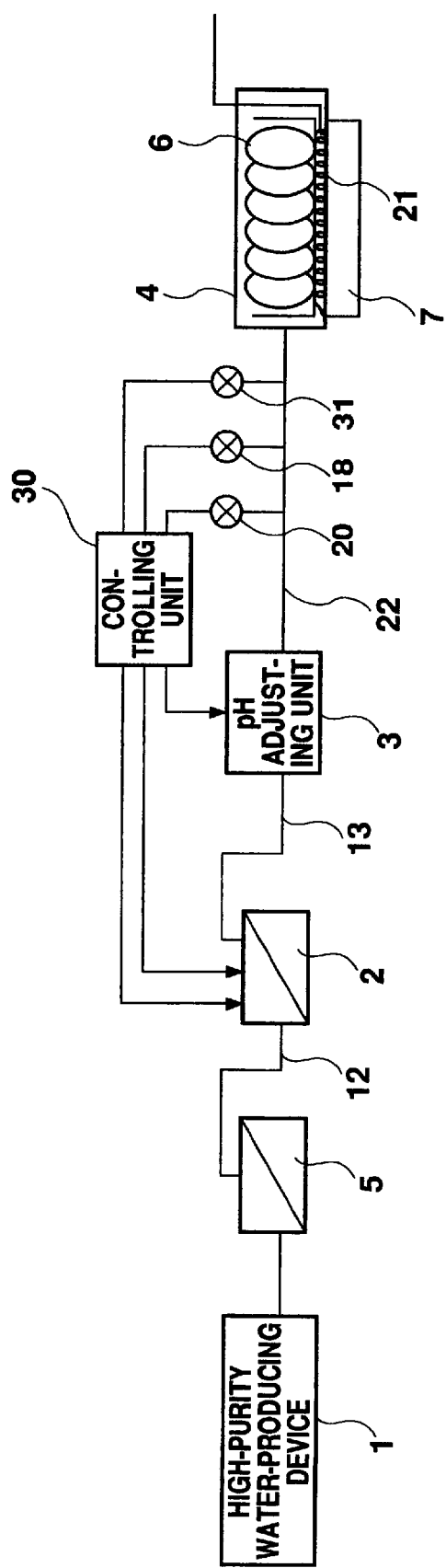
FIG. 5 is a conceptual diagram showing the configuration of a cleaning device according to the third embodiment of the invention.

According to the cleaning method of the second embodiment, in the process of cleaning electronic parts members or the like such as silicon wafer, it is unlikely to roughen the surface thereof and to form a thick oxide film thereon, compared with the conventional method cleaning the surface of the wafer using high-purity water. Therefore, the method according to the present invention provide the effects that the surface of the electronic parts members or the like can be cleaned easily to obtain perfectly clean surface, Third Embodiment As shown in FIG. 5, the configuration of the third embodiment as a whole is basically the same as the first and second

TABLE 4

| | CLEANING SOLUTION | | | OXIDE FILM THICKNESS (nm) | | DEGREE OF ROUGHNESS (nm) | |
|---|---|---|---|---|---|---|---|
| | KIND | OXIDATION-REDUCTION POTENTIAL | pH | BEFORE TREATMENT | AFTER TREATMENT | BEFORE TREATMENT | AFTER TREATMENT |
| EXAMPLE 1 | ACID IC CLEANING SOLUTION *1 | −200 mV vs NHE | 5.8 | 0.11 | 0.11 | 0.19 | 0.18 |
| EXAMPLE 2 | ACID IC CLEANING SOLUTION *2 | −200 mV vs NHE | 5.8 | 0.13 | 0.12 | 0.21 | 0.21 |
| COMPARATIVE EXAMPLE 1 | HIGH-PURITY WATER | +250 mV vs NHE | 7.1 | 0.12 | 0.82 | 0.20 | 0.64 |

*1 DISSOLVED HYDROGEN GAS CONCENTRATION: 1.2 ppm, ACID IC CLEANING SOLUTION WITH pH ADJUSTED WITH HYDROCHLORIC ACID.
*2 DISSOLVED HYDROGEN GAS CONCENTRATION: 1.2 ppm, ACID IC CLEANING SOLUTION WITH pH ADJUSTED BY DISSOLVING A CARBON DIOXIDE GAS.

The value of oxide film thickness on the surface of the wafers in Table 4 is an average value of 25 wafers measured on an X-ray photoelectron spectroscope (made by Seiko Electronic Industry:ESCA-200).

The value of the degree of roughness of the wafers is an average value of 25 wafers measured on an interatomicembodiment, except that in the third embodiment, an ozone gas is dissolved in the gas-dissolving bath 2. Furthermore, cleaning solution is adjusted to be alkaline in the pH-adjusting unit 3. There is arranged a dissolved ozone gas concentration meter 31 in place of the dissolved hydrogen gas concentration meter 19.

In the gas-dissolving bath 2, an ozone gas is dissolved in high-purity water produced in the high-purity water-producing device 1. Dissolving the ozone gas in high-purity water can produce cleaning solution with a positive oxidation-reduction potential, which is suitable for removing organic matter on the surface of the wafer and the like. The ozone gas is dissolved in the gas-dissolving bath 2 so as to have the concentration of the dissolved ozone gas generally not less than 0.05 ppm, and preferably in the range from 1 to 10 ppm at 25° C. under atmospheric pressure. Since degassing of high-purity water supplied to the gas-dissolving unit 2 is usually performed in the production thereof, the concentration of dissolved gasses in high-purity water is very low. However, since nitrogen gas and carbon dioxide gas react with the ozone gas and dissociate in water to produce ions thereof, thereby lowering the resistivity of high-purity water, it is preferable to remove the remaining dissolved nitrogen and carbon dioxide gasses more thoroughly by way of the degassing unit 5, before introducing high-purity water into the gas-dissolving bath 2.

In the degassing unit 5 as mentioned above, the concentration of total remaining dissolved gasses in high-purity water supplied to the gas-dissolving bath 2 is made less than 10 ppm, and preferably 2 ppm or less by degassing in the degassing unit 5. If the concentration of dissolved gasses is 10 ppm or more, during cleaning bubbles are formed to adhere to the objects to be cleaned, thus lowering cleaning effect for the bubble-adhered part. In the degassing unit 5, as the method for the degassing dissolved gasses, vacuum degassing via gas permeable membrane is preferable.

Methods for dissolving a ozone gas in high-purity water can be exemplified by various processes such as ozone gas introduction and dissolution into high-purity water by way of gas permeable membrane; ozone gas bubbling and dissolution into high-purity water; ozone gas dissolution into high-purity water by way of ejector; ozone gas introduction into suction side of a pump and dissolution by means of agitation inside the pump which supplies high-purity water to the gas-dissolving bath 2. The ozone gas to be dissolved in high-purity water in the gas-dissolving bath 2 is preferably the high-purity ozone gas produced by reducing hydroxyl ion in high-purity water by way of the electrolysis of high-purity water.

Gas permeable membrane used in the gas-dissolving bath 2 and the degassing unit 5 includes membrane made from materials having an affinity to gasses, such as silicone and the like, and hydrophobic materials such as fluorine resin and the like, as mentioned earlier. Such membrane is manufactured to have a number of fine pores and configured to permeate gas, but not water. Gas permeable membrane may be constructed as hollow yarn. As the method for degassing or gas dissolving, hollow yarn-type membrane may be configured to permeate gas either from inside of the hollow yarn to outside or in the reverse direction.

The gas-dissolving bath 2 is the same configuration as that shown in FIG. 2. In this embodiment, however, an ozone gas instead of a hydrogen gas is dissolved. Namely, the ozone gas is dissolved in high-purity water supplied through a high-purity water supply piping 12 to the gas-dissolving bath 2 by way of gas permeable membrane 11 and high-purity water containing the dissolved ozone gas is delivered through a supply piping 13 to the pH-adjusting unit 3. The ozone gas is supplied through a hydrogen gas supply piping 10 to the gas-dissolving bath 2.

After dissolving the ozone gas in high-purity water in the gas-dissolving bath 2, in the pH-adjusting unit 3, pH thereof is adjusted to be alkaline. The cleaning method according to the present invention utilizes the fact that the ozone gas in alkaline cleaning solution decomposes, and the ozone gas thus decomposed removes organic matter on the surface of the silicon wafer or the like. Since the higher the pH of cleaning solution, the faster the decomposition speed of the ozone gas, the effect of removing organic matter per unit time increases. However, if pH is too high, the effect of removing organic matter dissipates in a short period of time. Accordingly, pH of cleaning solution is preferably 11 or less, and more preferably in the range from 9 to 11, and most preferably in the range from 10 to 10.5. Moreover, for the reason mentioned above, high-purity water containing the dissolved ozone gas is preferably brought to alkali immediately before cleaning.

In order to adjust pH, alkaline solution or gas is dissolved in high-purity water containing the dissolved ozone gas. As an alkali, ammonia water and ammonia gas is preferable. When alkaline solution is used to adjust pH, the pH-adjusting unit 3 may include, for example, an alkali reservoir 23 and pump 24 as shown in FIG. 3, and alkaline solution is added and mixed anywhere in middle of the piping supplying liquid from the gas-dissolving bath 2 to the cleaning bath 4. In FIG. 3, 25 denotes a control valve to adjust feed amount of alkali.

When alkaline gas is used to adjust pH, the pH-adjusting unit 3 may include, for example, an alkaline gas supply unit 26 and a gas-dissolving bath 27 as shown in FIG. 4. As the gas-dissolving bath 27, a structure with gas permeable membrane 11 similar to the gas-dissolving bath 2 for dissolving an ozone gas as mentioned above may be used.

The alkaline cleaning solution with pH being adjusted in the pH-adjusting unit 3 to be delivered to the cleaning bath 4 needs to be alkaline and have a positive oxidation-reduction potential due to the dissolved ozone gas. To accomplish this, it is preferable to dispose a redox potentiometer 18, dissolved ozone gas concentration meter 31 and hydrogen ion concentration meter 20 anywhere along the cleaning solution supply piping 22 supplying cleaning solution to the cleaning bath 4 to always monitor oxidation-reduction potential, dissolved ozone gas concentration and pH of the cleaning solution so as to enable controlling the amount of the ozone gas dissolved in high-purity water in the gas-dissolving bath 2, and the amount of alkali to be added in the pH-adjusting unit 3. The amount of the ozone gas to be dissolved and the amount of alkali to be added are controlled by a controlling unit 30 as shown in FIG. 1.

The configuration and operation of the heater 21 and ultrasonic wave application unit 7 as well as dissolution of rare gas, air tight structure of cleaning bath and location where pH adjustment is carried out are the same as those of the first and second embodiment.

Example of the Third Embodiment

The present invention will be described in detail by mentioning Example and Comparative Example.

Example 3-1 through 3-6, Comparative Example 3-1 through 3-

Surface of a silicon wafer (n+Si 100) of six inch in size was cleaned with RCA to remove impurities and then soaked in diluted hydrofluoric acid in the concentration of 0.5% for ten minutes. The wafer was then rinsed using overflow rinse method for 5 minutes and then further cleaned with a sulfuric acid-hydrogen peroxide mixture solution (98% sul furic acid: 30% hydrogen peroxide solution=4:1, by volume ratio) at 130° C. The wafer was rinsed with high-purity water, dried and then closely attached to commercially available wrapping film made of polyethylene in a manner that prevents air bubble from entering the surface of the wafer, and allowed to stand for one day in a clean room in order to transfer organic matter adhered to the surface of the wrapping film onto the surface of the silicon wafer. The polyethylene wrapping film attached to the surface of the silicon wafer was detached to successively measure the surface contact angle of the wafer by high-purity water dropping test as an indicator of adhesion of organic matter on the surface of the wafer. The silicon wafer was then cleaned with such cleaning solutions under such conditions as shown in Table 5 and then dried to successively measure the surface contact angle again to check the effect on the removal of organic matter. The results are shown in FIG. 5. The surface contact angle of the silicon wafer before polluted with the polyethylene wrapping film was 21° (an average value of 25 wafers).

TABLE 5

| | | | | | | PROPERTIES OF CLEANING SOLUTION | | | |
|---|---|---|---|---|---|---|---|---|---|
| | | CONCENTRATION OF DISSOLVED GAS (ppm) | | | | OXIDATION-REDUCTION POTENTIAL mV | pH | pH ADJUSTING METHOD | APPLICATION OF ULTRA-SONIC WAVE |
| | | $O_2$ | $N_2$ | $CO_2$ | $O_2$ | (vs. NHE) | pH | | |
| EXAMPLE | | | | | | | | | |
| | 1 | <1 | <1 | <1 | 5 | 900 | 9 | ADDITION OF AMMONIA WATER | NONE |
| | 2 | <1 | <1 | <1 | 5 | 750 | 10.5 | ADDITION OF AMMONIA WATER | NONE |
| | 3 | <1 | <1 | <1 | 5 | 750 | 10.5 | ADDITION OF AMMONIA WATER | NONE |
| | 4 | <1 | <1 | <1 | 5 | 900 | 9 | ADDITION OF AMMONIA GAS | NONE |
| | 5 | <1 | <1 | <1 | 5 | 750 | 10.5 | ADDITION OF AMMONIA GAS | NONE |
| | 6 | <1 | <1 | <1 | 5 | 750 | 10.5 | ADDITION OF AMMONIA GAS | NONE |
| COMPARATIVE EXAMPLE | | | | | | | | | |
| | 1 | <1 | <1 | <1 | 0 | 1100 | 7 | HIGH-PURITY WATER | NONE |
| | 2 | <1 | <1 | <1 | 5 | 1300 | 4 | ADDITION OF HYDROCHLORIC ACID | NONE |
| | 3 | <1 | <1 | <1 | 0 | 900 | 9 | ADDITION OF AMMONIA WATER | NONE |
| | 4 | <1 | <1 | <1 | 5 | 1100 | 7 | HIGH-PURITY WATER CONTAINING DISSOLVED OZONE GAS | NONE |
| | 5 | <1 | <1 | <1 | 0 | 1500 | 0 | SULFURIC ACID-HYDROGEN PEROXIDE MIXTURE SOLUTION | NONE |

| | | CLEANING CONDITION | | | SURFACE CONTACT ANGLE OF THE WAFER BY HIGH-PURITY WATER DROPPING TEST (AN AVERAGE VALUE OF 25 WAFERS) | |
|---|---|---|---|---|---|---|
| | | METHOD OF CLEANING | TEMPERATURE OF CLEANING SOLUTION | CLEANING TIME (min.) | BEFORE CLEANING | AFTER CLEANING |
| EXAMPLE | | | | | | |
| | 1 | BATCH-TYPE OVERFLOW METHOD (2 L min.) | 25° C. (ROOM TEMPERATURE) | 10 | 66° | 23° |
| | 2 | BATCH-TYPE OVERFLOW METHOD (2 L min.) | 25° C. (ROOM TEMPERATURE) | 10 | 65° | 22° |
| | 3 | BATCH-TYPE OVERFLOW METHOD (2 L min.) | 60° C. | 10 | 65° | 21° |
| | 4 | BATCH-TYPE OVERFLOW | 25° C. (ROOM | | | |

TABLE 5-continued

| | | METHOD (2 L min.) | TEMPERATURE) | | | |
|---|---|---|---|---|---|---|
| | 5 | BATCH-TYPE OVERFLOW METHOD (2 L min.) | 25° C. (ROOM TEMPERATURE) | 10 | 67° | 23° |
| | 6 | BATCH-TYPE OVERFLOW METHOD (2 L min.) | 60° C. | 10 | 66° | 21° |
| COMPARATIVE EXAMPLE | | | | | | |
| | 1 | BATCH-TYPE OVERFLOW METHOD (2 L min.) | 25° C. (ROOM TEMPERATURE) | 10 | 65° | 63° |
| | 2 | BATCH-TYPE OVERFLOW METHOD (2 L min.) | 25° C. (ROOM TEMPERATURE) | 10 | 66° | 45° |
| | 3 | BATCH-TYPE OVERFLOW METHOD (2 L min.) | 25° C. (ROOM TEMPERATURE) | 10 | 65° | 50° |
| | 4 | BATCH-TYPE OVERFLOW METHOD (2 L min.) | 25° C. (ROOM TEMPERATURE) | 10 | 67° | 30° |
| | 5 | BATCH-TYPE | 130° C. | 10 | 67° | 23° |

Comparative Example 3-4

The process of Example 3-1 through 3-6 and Comparative Example 3-1 through 3-1 was repeated except that cleaning solution containing an ozone gas of 5 ppm was used. The result of measuring contact angle of the surface of the silicon wafer before and after cleaning is shown in Table 5.

Comparative Example 3-5

The process of Example 3-1 through 3-6 and Comparative Example 3-1 through 3-1 was repeated except that as cleaning solution a sulfuric acid-hydrogen peroxide mixture solution (98% sulfuric acid: 30% hydrogen peroxide solution=4:1, by volume ratio) was used batchwise at 130° C. The result of measuring contact angle of the surface of the silicon wafer before and after cleaning is shown in Table 5.

Example 3-7 through 3-12, Comparative Example 3-6 through 3-8

As with the process of Example 3-1 through 3-6, after RCA cleaning, cleaning with diluted hydrofluoric acid, and rinsing with high-purity water, the silicon wafer was polluted with organic matter by means of the wrapping film made of polyethylene. After measuring the contact angle of the surface of the silicon wafer thus prepared, the silicon wafer was then cleaned with such cleaning solutions under such conditions as shown in Table 6 while applying ultrasonic wave of 950 kHz, 1200 w and then dried to successively measure the surface contact angle again. The results are shown

TABLE 6

| | | PROPERTIES OF CLEANING SOLUTION | | | | | | | |
|---|---|---|---|---|---|---|---|---|---|
| | | CONCENTRATION OF DISSOLVED GAS (ppm) | | | | OXIDATION-REDUCTION POTENTIAL mV | | pH ADJUSTING | APPLICATION OF ULTRA-SONIC |
| | | $O_2$ | $N_2$ | $CO_2$ | $O_2$ | (vs. NHE) | pH | METHOD | WAVE |
| EXAMPLE | | | | | | | | | |
| | 7 | <1 | <1 | <1 | 5 | 900 | 9 | ADDITION OF AMMONIA WATER | APPLIED 950 kHz 1200 W |
| | 8 | <1 | <1 | <1 | 5 | 750 | 10.5 | ADDITION OF AMMONIA WATER | APPLIED 950 kHz 1200 W |
| | 9 | <1 | <1 | <1 | 5 | 750 | 10.5 | ADDITION OF AMMONIA WATER | APPLIED 950 kHz 1200 W |

TABLE 6-continued

| | | | | | | | | |
|---|---|---|---|---|---|---|---|---|
| 10 | <1 | <1 | <1 | 5 | 900 | 9 | ADDITION OF AMMONIA GAS | APPLIED 950 kHz 1200 W |
| 11 | <1 | <1 | <1 | 5 | 750 | 10.5 | ADDITION OF AMMONIA GAS | APPLIED 950 kHz 1200 W |
| 12 | <1 | <1 | <1 | 5 | 750 | 10.5 | ADDITION OF AMMONIA GAS | APPLIED 950 kHz 1200 W |
| COMPARATIVE EXAMPLE | | | | | | | | |
| 6 | <1 | <1 | <1 | 0 | 1100 | 7 | HIGH-PURITY WATER | APPLIED 950 kHz 1200 W |
| 7 | <1 | <1 | <1 | 5 | 1300 | 4 | ADDITION OF HYDROCHLORIC ACID | APPLIED 950 kHz 1200 W |
| 8 | <1 | <1 | <1 | 0 | 900 | 9 | ADDITION OF AMMONIA WATER | APPLIED 950 kHz 1200 W |
| 9 | <1 | <1 | <1 | 5 | 1100 | 7 | HIGH-PURITY WATER CONTAINING DISSOLVED OZONE GAS | APPLIED 950 kHz 1200 W |
| 10 | <1 | <1 | <1 | 0 | 1500 | 0 | SULFURIC ACID-HYDROGEN PEROXIDE MIXTURE SOLUTION | APPLIED 950 kHz 1200 W |

| | CLEANING CONDITION | | | SURFACE CONTACT ANGLE OF THE WAFER BY HIGH-PURITY WATER DROPPING TEST (AN AVERAGE VALUE OF 25 WAFERS) | |
|---|---|---|---|---|---|
| | METHOD OF CLEANING | TEMPERATURE OF CLEANING SOLUTION | CLEANING TIME (min.) | BEFORE CLEANING | AFTER CLEANING |
| EXAMPLE | | | | | |
| 7 | BATCH-TYPE OVERFLOW METHOD (2 L min.) | 25° C. (ROOM TEMPERATURE) | 10 | 67° | 22° |
| 8 | BATCH-TYPE OVERFLOW METHOD (2 L min.) | 25° C. (ROOM TEMPERATURE) | 10 | 66° | 21° |
| 9 | BATCH-TYPE OVERFLOW METHOD (2 L min.) | 60° C. | 10 | 65° | 21° |
| 10 | BATCH-TYPE OVERFLOW METHOD (2 L min.) | 25° C. (ROOM TEMPERATURE) | 10 | 66° | 23° |
| 11 | BATCH-TYPE OVERFLOW METHOD (2 L min.) | 25° C. (ROOM TEMPERATURE) | 10 | 66° | 22° |
| 12 | BATCH-TYPE OVERFLOW METHOD (2 L min.) | 60° C. | 10 | 66° | 21° |
| COMPARATIVE EXAMPLE | | | | | |
| 6 | BATCH-TYPE OVERFLOW METHOD (2 L min.) | 25° C. (ROOM TEMPERATURE) | 10 | 65° | 55° |
| 7 | BATCH-TYPE OVERFLOW METHOD (2 L min.) | 25° C. (ROOM TEMPERATURE) | 10 | 66° | 40° |
| 8 | BATCH-TYPE OVERFLOW METHOD (2 L min.) | 25° C. (ROOM TEMPERATURE) | 10 | 67° | 45° |

TABLE 6-continued

| 9 | BATCH-TYPE OVERFLOW METHOD (2 L min.) | 25° C. (ROOM TEMPERATURE) | 10 | 67° | 28° |
| 10 | BATCH-TYPE | 130° C. | 10 | 67° | 22° |

Comparative Example 3-9

The process of Example 3-1 through 3-6 and Comparative Example 3-1 through 3-1 was repeated except that cleaning solution containing ozone gas of 5 ppm was used. The result of measuring contact angle of the surface of the silicon wafer before and after cleaning is shown in Table 6.

Comparative Example 3-10

The process of Example 3-1through 3-6 and Comparative Example 3-1 through 3-1 was repeated except that as cleaning solution a sulfuric acid-hydrogen peroxide mixture solution (98% sulfuric acid: 30% hydrogen peroxide solution=4:1, by volume ratio) was used batchwise at 130° C. The result of measuring contact angle of the surface of the silicon wafer before and after cleaning is shown in Table 6.

According to the method of the third embodiment, in the process of cleaning electronic parts members or the like such as silicon wafer, the surface of the electronic parts members can be cleaned to surely remove organic matter in a short period of time, compared with the conventional method removing organic matter using a sulfuric acid-hydrogen peroxide mixture solution or high-purity water containing the dissolved ozone gas only. Therefore, the method according to the present invention provide the effects that the amount of reagent for cleaning and high-purity water for rinsing after cleaning, and therefore the cost for reagent and high-purity water can be reduced, effluent treatment cost after cleaning and cleaning can be reduced, and consequently, manufacturing cost of electronic parts member can be reduced.

INDUSTRIAL APPLICABILITY

It is applicable to the process of cleaning electronic parts members, such as silicon wafers.

What is claimed is:

1. A method for cleaning electronic parts members or the like, comprising providing high-purity water and a hydrogen gas separately, degassing the high-purity water to contain a dissolved oxygen gas of 2 ppm or less, and introducing the hydrogen gas into the degassed high-purity water to dissolve the hydrogen gas therein to provide cleaning solution having a negative oxidation-reduction potential, and washing the electronic parts members or the like with the cleaning solution.

2. The method according to claim 1, wherein said cleaning solution contains a dissolved hydrogen gas of 0.05 ppm or more.

3. The method according to claim 1, wherein said electronic parts members or the like are cleaned with said cleaning solution while applying ultrasonic wave.

4. The method according to claim 3, wherein the frequency of said ultrasonic wave is 30 kHz or more.

5. The method according to claim 3, wherein said cleaning solution further contains a dissolved rare gas.

6. The method according to claim 1, wherein the temperature of said cleaning solution is adjusted to be 20° C. –60° C. during cleaning.

7. The method according to claim 1, wherein said hydrogen gas is dissolved in high-purity water by way of gas permeable membrane.

8. A device for cleaning electronic parts members or the like, said device comprising a high-purity water-producing device for producing high-purity water, a hydrogen gas supplying unit for supplying a hydrogen gas, a degassing unit for degassing the high-purity water from the high-purity water-producing device to contain a dissolved oxygen gas of 2 ppm, a gas-dissolving unit for dissolving the hydrogen gas supplied from said hydrogen gas supplying unit in the produced high-purity water, a cleaning unit for cleaning said electronic parts members or the like with cleaning solution containing a hydrogen gas dissolved in high-purity water in the gas-dissolving unit and having a negative oxidation-reduction potential.

9. The device according to claim 8, said device further comprising a pH-adjusting unit for adjusting pH of said cleaning solution.

10. The device according to claim 9, said device further comprising a dissolved hydrogen gas concentration detecting unit for detecting dissolved hydrogen gas concentration in said cleaning solution, and a gas dissolution control unit for controlling the dissolution of a hydrogen gas in said gas-dissolving unit based on the dissolved hydrogen gas concentration detected.

11. The device according to claim 9, said device further comprising a pH detecting unit for detecting pH of said cleaning solution, and a pH control unit for controlling pH adjustment in said pH-adjusting unit based on the detected pH.

12. The device according to claim 8, said device further comprising a ultrasonic wave applying unit for applying ultrasonic wave to cleaning solution in said cleaning unit.

13. A method for cleaning electronic parts members or the like, comprising providing high-purity water and an ozone gas separately, introducing the ozone gas into the high-purity water to dissolve the ozone gas therein to produce alkaline cleaning solution having a positive oxidation-reduction potential, and cleaning the electronic parts members or the like with the alkaline cleaning solution.

14. The method according to claim 13, wherein said cleaning solution contains a dissolved ozone gas of 0.05 ppm or more.

15. The method according to claim 13, wherein pH of said cleaning solution is 7<pH≦11.

16. The method according to claim 13, wherein said cleaning solution uses high-purity water degassed to contain a dissolved oxygen gas of less than 2 ppm.

17. The method according to claim 13, wherein said electronic parts members or the like are cleaned with said cleaning solution while applying ultrasonic wave.

18. The method according to claim 17, wherein the frequency of said ultrasonic wave is 30 kHz or more.

19. The method according to claim 13, wherein the temperature of said cleaning solution is adjusted to be 20° C. –60° C. during cleaning.

20. The method according to claim 13, wherein said ozone gas is dissolved in high-purity water by way of gas permeable membrane.

21. A device for cleaning electronic parts members or the like, said device comprising a high-purity water-producing device for producing high-purity water, an ozone gas-supplying unit for supplying an ozone gas, a gas-dissolving unit for dissolving an ozone gas in the produced high-purity water, and a pH-adjusting unit for adjusting pH of cleaning solution which is produced by dissolving an ozone gas supplied from said ozone gas-supplying unit in the high-purity water in the gas-dissolving unit to be alkaline.

22. The device according to claim 21, said device further comprising a dissolved ozone gas concentration detecting unit for detecting dissolved ozone gas concentration in said cleaning solution, and a gas dissolution control unit for controlling the dissolution of a ozone gas in said gas-dissolving unit based on the dissolved ozone gas concentration detected.

23. The device according to claim 21, said device further comprising a pH detecting unit for detecting pH of said cleaning solution, and a pH control unit for controlling pH adjustment in said pH-adjusting unit based on the detected pH.

24. The device according to claim 21, said device further comprising a ultrasonic wave applying unit for applying ultrasonic wave to said cleaning solution in said cleaning device.

25. The method according to claim 1, wherein pH of said cleaning solution is $7 \leqq pH < 11$.

26. The method according to claim 1, wherein pH of said cleaning solution is $3 \leqq pH < 7$.

* * * * *